United States Patent [19]
Konishi

[11] Patent Number: 6,053,977
[45] Date of Patent: Apr. 25, 2000

[54] COATING APPARATUS

[75] Inventor: Nobuo Konishi, Yamanashi-ken, Japan

[73] Assignee: Tokyo Electron Limited, Tokyo, Japan

[21] Appl. No.: 09/105,171

[22] Filed: Jun. 26, 1998

[30] Foreign Application Priority Data

Jul. 4, 1997 [JP] Japan ..................................... 9-193375

[51] Int. Cl.[7] .............................. B05B 13/04; B05C 11/02
[52] U.S. Cl. ............................. 118/320; 118/52; 427/240; 427/425
[58] Field of Search ...................... 118/52, 320; 427/240, 427/425, 2.11, 4

[56] References Cited

U.S. PATENT DOCUMENTS

| | | | |
|---|---|---|---|
| 4,838,979 | 6/1989 | Nishida et al. | |
| 5,578,127 | 11/1996 | Kimura | 118/695 |
| 5,658,615 | 8/1997 | Hasebe et al. | 427/240 |
| 5,861,061 | 1/1999 | Hayes et al. | 118/52 |
| 5,879,457 | 3/1999 | Sahoda et al. | 118/319 |
| 5,893,004 | 4/1999 | Yamamura | 396/611 |

OTHER PUBLICATIONS

Derwent Abstracts, AN 97–266875/24, JP 09–094516, Apr. 8, 1997, and Patent Abstracts of Japan, JP 09–094516, Apr. 8, 1997.

Patent Abstracts of Japan, JP 6–077121, Mar. 18, 1994, and Derwent Abstracts, AN 94–129877/16, JP 6–077121, Mar. 18, 1994.

Patent Abstracts of Japan, JP 6–13221, May 13, 1994, and Derwent Abstracts, AN 94–194859/24, JP 6–132211, May 13, 1994.

Patent Abstracts of Japan, JP 7–066107, Mar. 10, 1995, and Derwent Abstracts, AN 95–142559/19, JP 7–066107, Mar. 10, 1995.

*Primary Examiner*—Shrive Beck
*Assistant Examiner*—Jennifer Calcagni
*Attorney, Agent, or Firm*—Oblon, Spivak, McClelland, Maier & Neustadt, P.C.

[57] ABSTRACT

A coating apparatus comprises a spin chuck for supporting a wafer rotatably, a driving mechanism for rotating the spin chuck, a nozzle for supplying a resist solution or a solvent to the wafer supported by the spin chuck, an outer cup arranged to surround the wafer supported by the spin chuck, an inner cup formed like a ring and arranged along an outer peripheral portion of the wafer to be coated over and in close vicinity of the outer peripheral portion upon coating, and an attaching and detaching mechanism for attaching and detaching the inner cup.

15 Claims, 4 Drawing Sheets

COATING APPARATUS

BACKGROUND OF THE INVENTION

The present invention relates to a coating apparatus for coating a resist solution, for example, on an object to be coated such as a semiconductor wafer, an LCD substrate, etc.

In the fabrication of the semiconductor device, circuit patterns are formed by a so-called photolithography technique in which photoresist is coated on the semiconductor wafer as an object to be processed, then exposed to correspond to the circuit patterns, and then developed.

During the photoresist coating step of these steps, while rotating the semiconductor wafer held on a spin chuck, a resist solution is supplied to a center surface portion of the semiconductor wafer from a nozzle provided over the semiconductor wafer such that the resist solution can be spread over the semiconductor wafer by a centrifugal force. Accordingly, a resist film can be coated uniformly on an overall surface of the semiconductor wafer. In this case, in order to prevent scattering of the resist and a solvent, a cup is provided to surround the semiconductor wafer and then an air whose temperature and humidity are controlled is supplied to an inside of the cup from opening portions of the cup to enable a stable coating.

However, for convenience of loading/unloading of the semiconductor wafer, an inner diameter of the cup is not set smaller than an inner diameter of the semiconductor wafer. Therefore, a sufficient wind speed cannot be obtained around the periphery of the wafer, and also a whistling phenomenon which may be due to a turbulent flow occurs on the outer peripheral portion of the wafer. As a result, the coating film having uniform film quality cannot be formed.

In addition, because of the rebound of resist mist, the peripheral portions of the wafer are contaminated to thus cause particles. Hence, the mist on the peripheral portion of the wafer has been removed by the solvent such as thinner, nevertheless its effect can be not sufficiently achieved because of the rebound of peripheral thinner. In addition, the resist mist has scattered around the cup to thus contaminate the outside of the cup.

BRIEF SUMMARY OF THE INVENTION

It is an object of the present invention to provide a coating apparatus which is capable of controlling an air flow around the peripheral portion of an object to be coated and preventing rebound of mist, etc. onto the object to be coated and scattering of the mist around the cup.

According to an aspect of the present invention, there is provided a coating apparatus comprising:

a supporting member for supporting a substrate to be coated rotatably;

a driving mechanism for rotating the supporting member;

a coating liquid supplying mechanism for supplying a coating solution to the substrate to be coated supported by the supporting member;

an outer cup arranged to surround the substrate to be coated supported by the supporting member;

an inner cup formed ring-like, and arranged along an outer peripheral portion of the substrate to be coated over and in close vicinity of the outer peripheral portion upon coating; and an attaching/detaching mechanism for attaching and detaching the inner cup.

Since the inner cup which is formed like a ring and arranged along an outer peripheral portion of the object to be coated over and in close vicinity of the outer peripheral portion upon coating is provided vertically movably, the air flows through a narrow clearance between the inner cup and the object to be coated during the coating process, so that the wind speed can be increased around the outer peripheral portion of the object to be coated and also the turbulent flow can be prevented. In addition, because of the presence of the inner cup, mists of the coating liquid can be prevented from rebounding onto the object to be coated. Further, since the solvent dose not rebound upon cleaning of the periphery of the object to be coated, a sufficient cleaning effect can be achieved. Furthermore, the resist mists can be prevented from scattering around the cup.

In this case, if the inner cup is put on the outer cup upon coating, the inner cup can be mounted only by putting the inner cup on the outer cup. Therefore, the inner cup can be simply mounted.

If the downward-inclined portion for centering the inner cup and the flange portion on which the inner cup is mounted are provided to the inner area of the outer cup when the inner cup is put on the outer cup upon coating, mounting of the inner cup can be easily effected by the attaching/detaching mechanism since the outer periphery of the inner cup can be put on the flange portion while being guided by the downward-inclined portion to its center position.

Still more, if the inner cup is provided to have a ring-like main body and a projection portion which projects downward around a total circumference of the inner portion and then a lower end surface of the projection portion is positioned along an outer peripheral portion of the object to be coated over and in vicinity of the outer peripheral portion upon coating, the above function of the inner cup can be achieved effectively by the projection portion of the inner cup.

Moreover, under the condition that the inner cup is formed as above, if a nozzle for discharging a removing liquid to remove the coating liquid on the object to be coated is provided and then a discharge outlet of the nozzle is directed toward an upper area of an outer surface of the projection portion of the inner cup, sufficient cleaning effect can be attained since rebounding of the removing liquid onto the object to be coated can be prevented in cleaning the periphery of the object to be coated.

Still more, if the inner cup is attached/detached and held by using the vacuum suction as the attaching/detaching mechanism, an attaching/detaching means never disturbs the coating operation.

Still more, if the inner cup is split radially into split pieces and then respective split pieces are set movably in the radial direction, the innercup can be moved backward to the outside in loading/unloading the wafer but it can be moved forward to a predetermined position in coating.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

Embodiments of the present invention will be explained in detail with reference to the accompanying drawings hereinafter.

Figure 1:
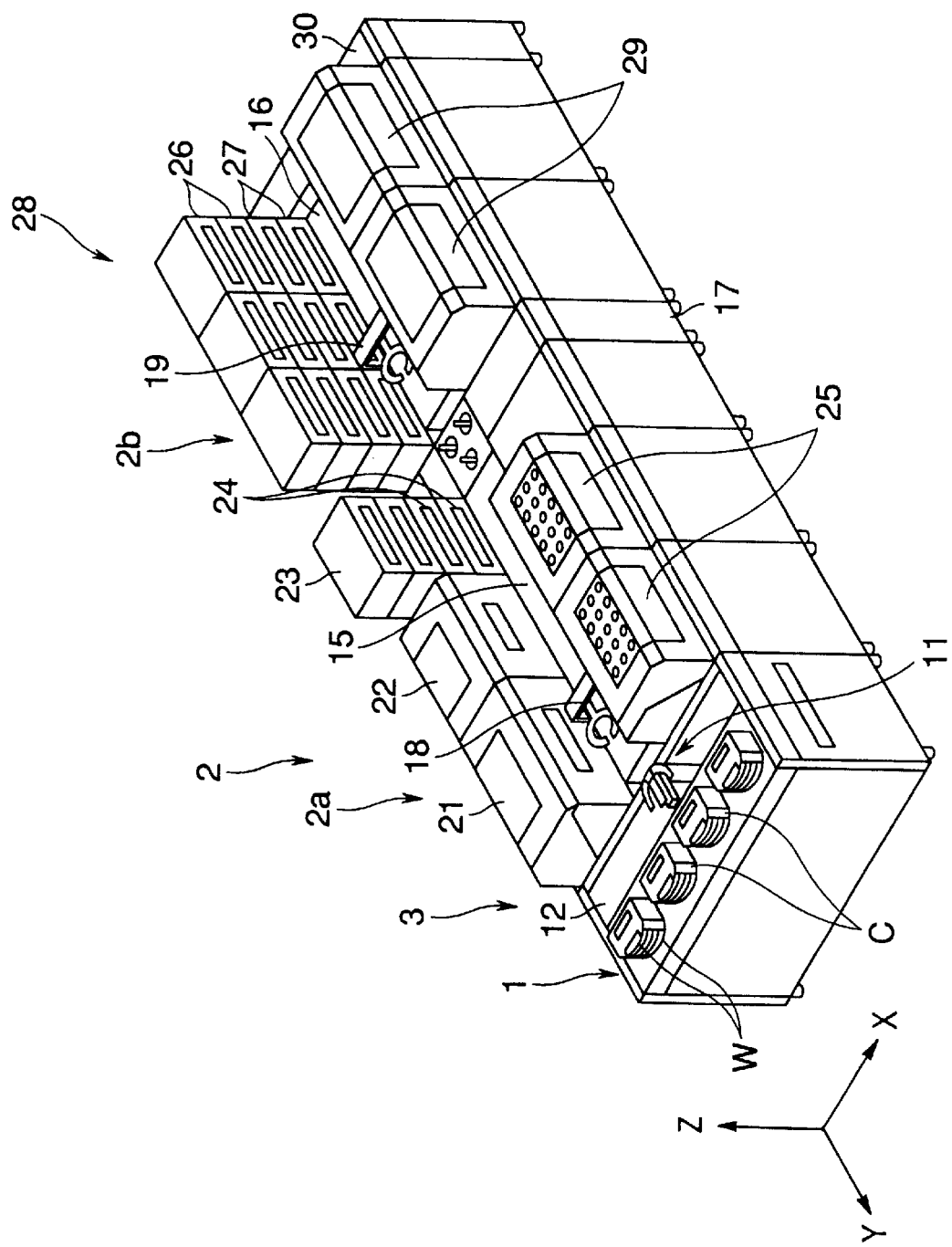
FIG. 1 is a perspective view showing a resist coating/developing system into which a resist coating apparatus as an object of the present invention is installed.

FIG. 1 is a perspective view showing a coating/developing process system for a semiconductor wafer, into which a coating apparatus as an object of the present invention is installed.

The coating/developing process system comprises a cassette station 1 on which a cassette C for holding a plurality of semiconductor wafers W therein is loaded, a processing section 2 equipped with a plurality of processing units for applying a series of processes including resist coating/developing processes to the semiconductor wafer, and a carrying mechanism 3 for carrying the semiconductor wafer W between the cassette C placed on the cassette station 1 and the processing section 2. Loading/unloading of the cassette C into/from the system is carried out by the cassette station 1. The carrying mechanism 3 has a carrying arm 11 which can move on a carrying path 12 provided along the cassette alignment direction. The semiconductor wafer W can be carried between the cassette C and the processing section 2 by using the carrying arm 11.

The processing section 2 is divided into a preceding stage section 2a and a succeeding stage section 2b. Passages 15, 16 are provided in the middle of the preceding stage section 2a and the succeeding stage section 2b respectively. Respective processing units are arranged on both sides of these passages 15, 16. A relay portion 17 is provided between the preceding stage section 2a and the succeeding stage section 2b.

The preceding stage section 2a is equipped with a main arm 18 which is movable along the passage 15. A brush cleaning unit 21, a rinsing unit 22, an adhesion process unit 23, and a cooling unit 24 are arranged on one side of the passage 15, while two resist coating units 25 as an object of the present invention are arranged on the other side of the passage 15. Also, the succeeding stage section 2b is equipped with a main arm 19 which is movable along the passage 16. A group of thermal system units 28 consisting of plural heating process units 26 and plural cooling process units 27 are arranged on one side of the passage 16, while two developing process units 29 are arranged on the other side of the passage 16. As the group of thermal system units 28, three sets of four-step units are aligned along the passage 16 wherein two upper steps are the heating process units 26 and two lower steps are the cooling process units 27. The heating process units 26 execute prebake to stabilize the resist, post exposure bake after the exposure has been completed, and post bake after the development has been completed. An interface section 30 which is used to transfer/receive the semiconductor wafer W between the succeeding stage section 2b and an exposure unit (not shown) is provided at the rear end of the succeeding stage section 2b.

The above main arm 18 has functions of transferring/receiving the semiconductor wafer W to/from the carrying arm 11 of the carrying mechanism 3, and loading/unloading the wafer W into/from respective processing units in the preceding stage section 2a, and transferring/receiving the wafer W to/from the relay section 17. Similarly, the above main arm 19 has functions of transferring/receiving the semiconductor wafer W to/from the relay section 17, and loading/unloading the wafer W into/from respective processing units in the succeeding stage section 2b, and transferring/receiving the wafer W to/from the interface section 30.

Like the above, space saving and improvement in efficiency of the processes can be attained by collecting respective processing units integratedly. The overall processing section 2 including these processing units is housed in a casing (not shown).

In the coating/developing process system constructed as above, the semiconductor wafer W in the cassette C is transferred to the processing section 2. First, the semiconductor wafer W is subjected to the cleaning process by the cleaning unit 21 and the rinsing unit 22, then is subjected to the hydrophobic process by the adhesion process unit 23 to enhance fixation of the resist, then is cooled by the cooling unit 24, and then is coated with the resist by the resist coating unit 25. Then, the semiconductor wafer W is subjected to the prebake process by one of the heating process units 26, then is cooled by the cooling units 27, then is carried to the exposure unit via the interface section 30. Predetermined patterns are exposed onto the semiconductor wafer W by the exposure unit. Then, the semiconductor wafer W is loaded into one of the heating process units 26 via the interface section 30 again, and then the post exposure bake process is applied to the wafer W therein. Then, the semiconductor wafer W is cooled by the cooling units 27 and then is subjected to the development process by the developing process unit 29, so that predetermined circuit patterns are formed on the wafer W. The semiconductor wafer W being subjected to the developing process is subjected to the post bake process by one of the heating process units 26, then is cooled by the cooling unit 27, and then is accommodated into a predetermined cassette on the cassette station 1 by means of the main arms 18, 19 and the carrying mechanism 3.

Next, the resist coating unit 25 according to an embodiment of the coating unit, which is an object of the present invention, will be explained hereinafter.

Figure 2:
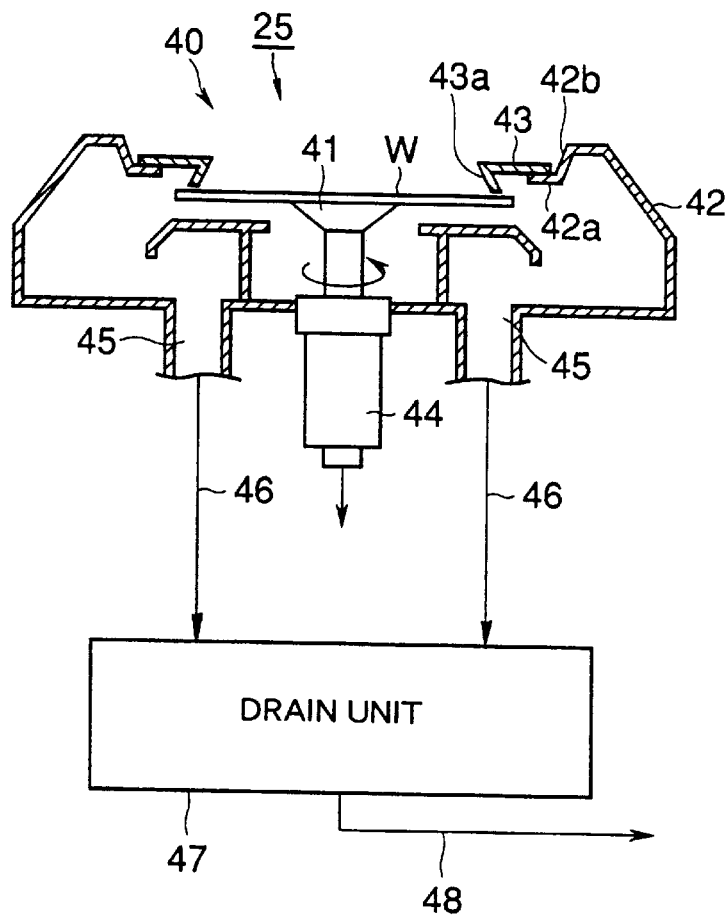
FIG. 2 is a schematic sectional view showing an example of a coating portion of a resist solution coating unit according to an embodiment of the present invention.

As shown in FIG. 2, the resist coating unit 25 has a coating portion 40 in the casing. The coating portion 40 has a spin chuck 41 which can serve as a supporting member for supporting the semiconductor wafer W horizontally by virtue of vacuum suction. An outer cup 42 is provided to surround the semiconductor wafer W supported by the spin chuck 41. The outer cup 42 has an inward-directed flange portion 42a, and a ring-like inner cup 43 is provided to be put on the flange portion 42a.

The spin chuck 41 can be rotated by a driving mechanism 44 such as a pulse motor, which is provided beneath the outer cup 42 and whose rotational speed can be controlled arbitrarily. An inside of the outer cup 42 can be exhausted by an exhausting means (not shown) via the center portion of the bottom. The resist solution and the solvent scattered during the coating process can be dropped down via the outside of the spin chuck 41, an exhaust liquid port 45 formed on the bottom of the outer cup 42, and exhaust liquid pipes 46, and thus can be exhausted to a drain tank 47 which is provided below the outer cup 42. A drain line 48 is connected to the drain tank 47 to discharge the drain to the outside of the system.

Figure 3:
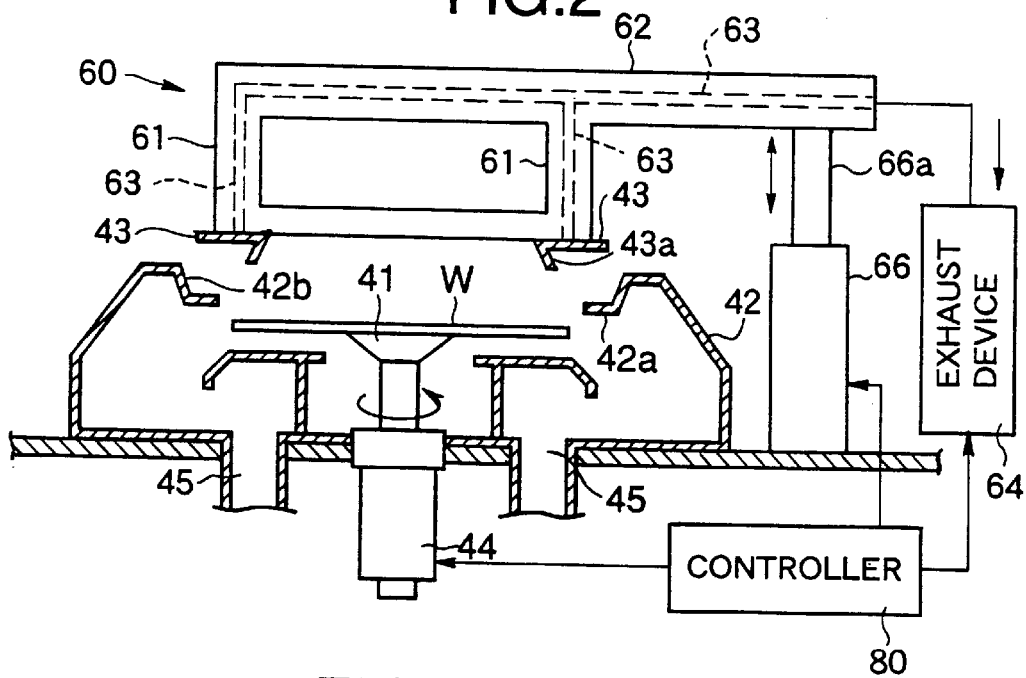
FIG. 3 is a sectional view showing a state wherein an inner cup is removed from the coating portion in FIG. 2.

As shown in FIG. 3, a mechanism 60 is provided for fitting the inner cup 43 into, and removing the same from, the outer cup 42. The mechanism 60 comprises a vertical arm 61 and a horizontal arm 62. The mechanism 60 has an exhaust passage 63 made in the arms 61 and 62. The exhaust passage 63 opens at one end at the lower surface of the vertical arm 61. The other end of the passage 63 is connected to a exhaust device 64. The horizontal arm 62 is coupled to the vertical arm 61 at one end and to the rod 66a of an elevating device 66. The cylinder 66 and the rod 66a constitute an elevating device. A controller 80 is provided for controlling the motor 44, the drain tank 47, the exhaust device 64, the elevating device 66, and sliding cylinders 73 (later described). The inner cup 43 can be detachably attached by an attaching/detaching mechanism 60 by virtue of vacuum suction. When the semiconductor wafer W is loaded/unloaded, the inner cup 43 can be removed from the coating portion by the attaching/detaching mechanism 60. Then, when the coating process is applied to the semiconductor wafer W, the inner cup 43 can be put on the flange portion 42a of the outer cup 42. A downward inclined portion 42b is formed on the outer cup 42. The inner cup 43 is guided by the downward inclined portion 42b to be centered in the outer cup 42. When the semiconductor wafer W is loaded/unloaded, the attaching/detaching mechanism 60 can be placed at the standby position not to disturb such loading/unloading.

Figure 4:
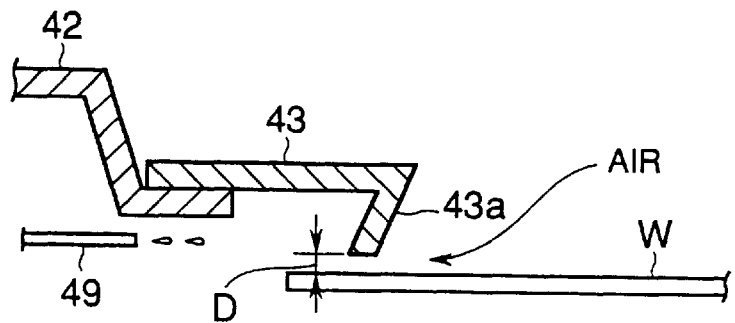
FIG. 4 is a schematic sectional view showing a pertinent portion of the coating portion in FIG. 2 in an enlarged fashion.

The inner cup 43 has a projection portion 43a which is projected downward along a total inner circumference of the ring-like main body. When the inner cup 43, as shown in FIG. 4, is put on the flange portion 42a of the outer cup 42, a lower end portion of the projection portion 43a can be positioned over and in close vicinity of the outer peripheral portion of the semiconductor wafer W. In this case, a distance D between a lower end surface of the projection portion 43a and the semiconductor wafer W is set narrowly to the extent of 1 to 5 mm. Hence, the wind speed around the periphery of the semiconductor wafer W can be made higher and also stabilized, as described later. Preferably plural types of the inner cups 43 should be prepared such that the distance D can be changed according to the type of resist, the number of revolution, etc. In order to clean the periphery of the wafer W, a peripheral cleaning nozzle 49 for discharging the solvent such as thinner is provided on the outside of the semiconductor wafer W. A discharge opening of the nozzle 49 is directed toward an upper area of an outer peripheral surface of the projection portion 43a of the inner cup 43.

Figure 5:
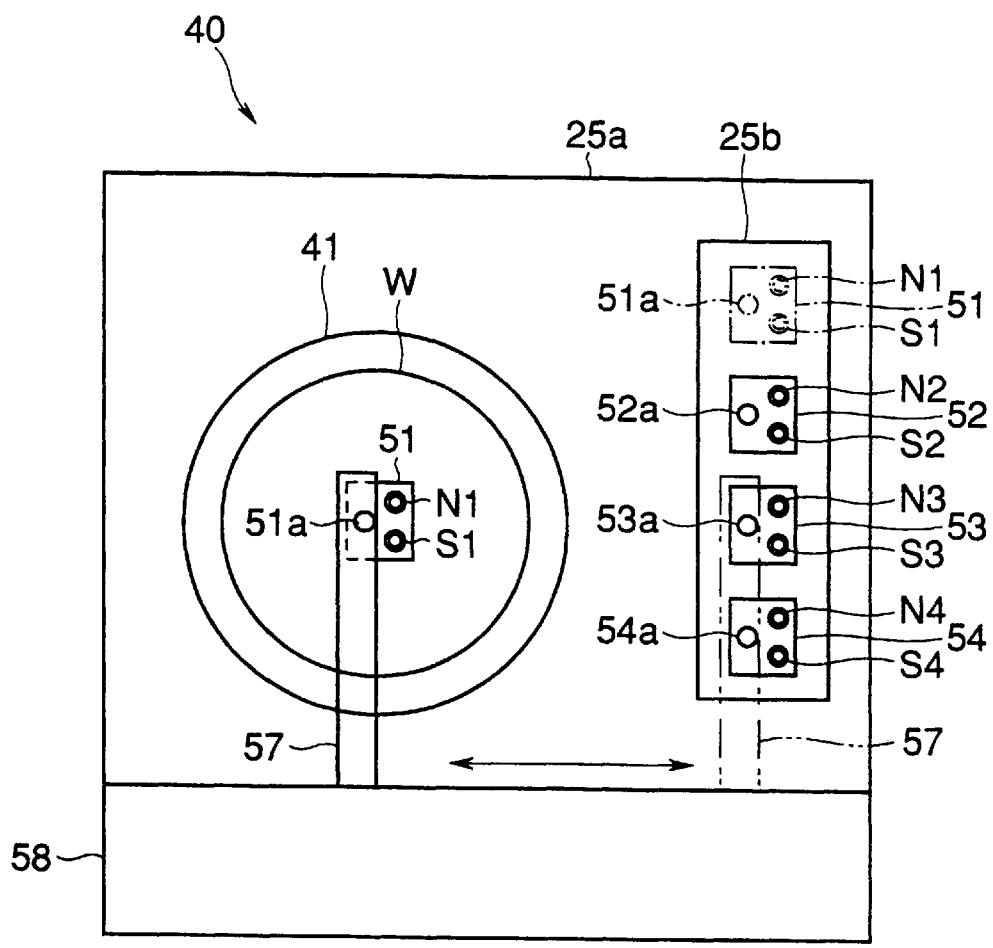
FIG. 5 is a plan view showing the coating portion of the resist solution coating unit according to the embodiment of the present invention.

As shown in FIG. 5, a holding portion 25b which can hold four nozzle holders 51, 52, 53, 54 is provided on a side area of a casing 25a of the coating unit 25. Resist solution discharging nozzles N1, N2, N3, N4 are held by the four nozzle holders 51, 52, 53, 54 respectively and also solvent nozzles S1, S2, S3, S4 are held by the four nozzle holders 51, 52, 53, 54 as pairs of resist solution discharging nozzles N1, N2, N3, N4. In order not to dry and solidify outlets of respective nozzles, insertion portions (not shown) which are used to put the outlets of respective nozzles in a solvent atmosphere are provided at a holding portion 25b. As described later, independent resist solution pipes are connected to the resist solution discharging nozzles N1, N2, N3, N4 and therefore four types of different resist solution can be coated. By hooking only the resist solution discharging nozzles N1, N2, N3, N4 on the nozzle holders 51, 52, 53, 54 respectively, the solvent nozzles S1, S2, S3, S4 formed as a shared type nozzle may be fitted to a scan arm 57 to be described later.

These nozzle holders 51, 52, 53, 54 can be fitted to the top end portion of the scan arm 57 by fitting portions 51a, 52a, 53a, 54a respectively. Selected one of these nozzle holders 51, 52, 53, 54, which is held by the scan arm 57, can be picked out from the holding portion 25b. The scan arm 57 can be moved by a scanning mechanism 58 three-dimensionally, i.e., in X, Y, Z directions. The nozzle holder picked out from the holding portion 25b (the nozzle holder 51 in FIGS. 2 and 3) is shifted up to a predetermined position over the semiconductor wafer W. The solvent and the resist solution are then discharged from the nozzle to then carry out the coating process.

In the coating process effected by such coating unit 25, first the semiconductor wafer W is loaded onto the spin chuck 41 as the supporting member and then is vacuum-sucked in the situation where the inner cup 43 is not fitted. Then, the attaching/detaching mechanism 60 which is sucking the inner cup 43 and is in a standby state is moved to a position over the semiconductor wafer W and then is moved downward to release the inner cup 43. At that time, the outer peripheral portion of the inner cup 43 is guided into the downward-inclined portion 42b of the outer cup 42, so that the inner cup 43 is put on the flange portion 42a of the outer cup 42 so as to achieve the centering. Thus, the lower end surface of the projection portion 43a of the inner cup 43 can be positioned over the outer peripheral portion of the semiconductor wafer W and in the close neighborhood of the outer peripheral portion thereof. In this event, the distance D between the lower end surface of the projection portion 43a and the semiconductor wafer W may be set to about 1 to 5 mm.

In this state, while rotating the semiconductor wafer W as well as the spin chuck 41 by the driving mechanism 44 at the predetermined number of revolution in the range of 1500 to 3000 rpm, for example, the solvent and the resist solution are discharged from the nozzles S1, N1 to thus effect the coating of the resist film. In this case, the temperature/humidity-controlled air is introduced into the outer cup 42 from the opening portion as a vertical laminar flow and such air flows to the outside along the semiconductor wafer W.

In the prior art, since the inner diameter of the cup has not been able to be formed smaller than the inner diameter of the semiconductor wafer W, the wind speed has been small around the outer peripheral portion of the semiconductor wafer W and also the whistling phenomenon which is caused due to the turbulent flow has occurred. However, if the inner cup 43 is provided detachably/attachably on the inside of the outer cup 42 and also the inner cup 43 is provided such that the lower end surface of the projection portion 43a of the inner cup 43 is positioned over and in close vicinity of the outer peripheral portion of the semiconductor wafer W during the coating operation, the wind speed can be increased when the air passes through a clearance between them and also the turbulent flow can be suppressed around the outer peripheral portion of the wafer. In this event, since such effects are largely changed according to the type of resist, the number of revolution of the semiconductor wafer W, and the above value D, the optimum combination must be grasped in advance in setting the conditions.

In addition, because of the presence of the inner cup 43, mists of the resist solution can be prevented from rebounding onto the semiconductor wafer W. Further, since the solvent in no way rebounds upon cleaning of the periphery of the semiconductor wafer W by discharging the solvent such as thinner from the nozzle 49, a sufficient cleaning effect can be achieved. Furthermore, because of the presence of the inner cup 43, the resist mists can be prevented from scattering around the cup.

Moreover, a mounting operation of the inner cup 43 is very simple since only putting of the inner cup 43 onto the outer cup 42 is needed. In this case, since the downward-inclined portion 42b and the flange portion 42a are provided to the outer cup 42, the outer peripheral portion of the inner cup 43 is put on the flange portion 42a while being guided by the downward-inclined portion 42b to its center position. Therefore, mounting of the inner cup 43 can be easily effected by the attaching/detaching mechanism 60. Still more, since the attaching/detaching mechanism 60 can be elevated with holding the inner cup 43 by virtue of vacuum suction, no trouble is caused in coating.

In this fashion, after the coating process has been completed, rotation of the spin chuck 41 is stopped, then the attaching/detaching mechanism 60 vacuum-sucks the inner cup 43 and is elevated, then the inner cup 43 is removed from the outer cup 42, and then the semiconductor wafer W is carried out from the coating unit 25.

Figure 7:
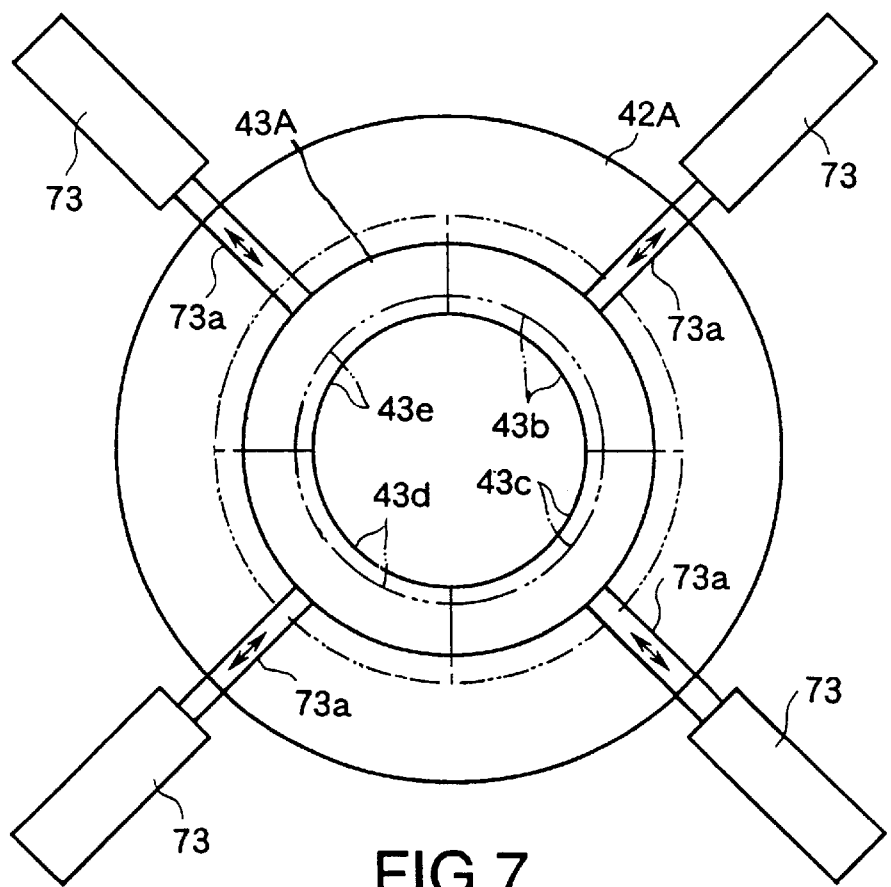
FIG. 7 is a plan view showing the coating portion shown in FIG. 6.

With the above, the case where the inner cup 43 can be moved vertically by the attaching/detaching mechanism 60 has been illustrated. But the inner cup may be provided as a split type inner cup 43A which can be slid radially, as shown in FIG. 7.

Figure 6:
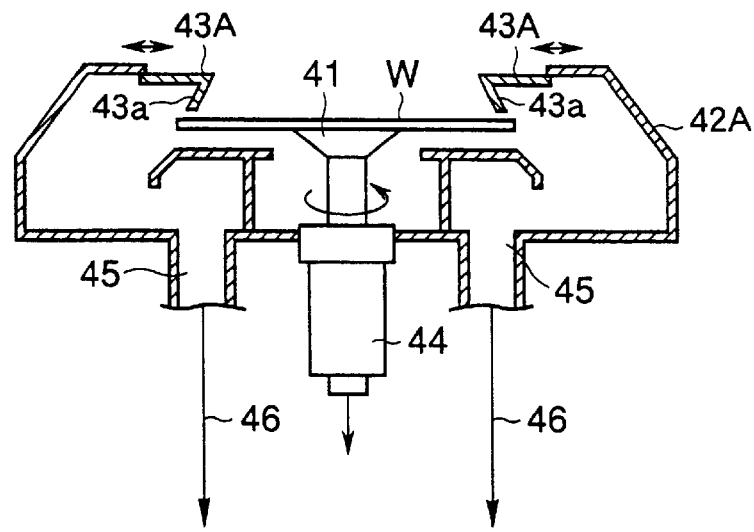
FIG. 6 is a schematic sectional view showing an example of a coating portion of a resist solution coating unit according to another embodiment of the present invention.

Such example will be explained hereunder. FIG. 6 is a sectional view showing such example of the inner cup. In FIG. 6, the same symbols are affixed to the same parts or elements as those in FIG. 2. In this example, an outer cup 42A in which the flange portion and the downward-inclined portion are not formed is employed. A split type inner cup 43A is provided to the outer cup 42A. The inner cup 43A has a projection portion 43a to control an air flow, like the above inner cup 43A. As shown in FIG. 7, the inner cup 43A is composed of four members 43b, 43c, 43d and 43e which are connected together, forming an annular unit. The members 43b to 43e are coupled to four sliding cylinders 73, respectively. When driven by the cylinders 73, the members 43b to 43e horizontally slide in the radial direction of the outer cup 42A. As the members 43b to 43e slide outwardly, the top opening of the outer cup 42A becomes larger, allowing the semiconductor wafer W to move into the outer cup 42A. After the wafer W has been thus loaded into the outer cup 42A, the sliding cylinders 73 may slide the members 43b to 43e toward the center of the outer cup 42A, thereby controlling the air flow near the wafer W. The air flow, thus controlled, prevents mist and the like from moving onto the wafer W or from scattering from the outer cup 42A.

The present invention is not limited to the above embodiment, and various modifications may be applied. For instance, although the case where the resist solution is coated has been explained in the above embodiment, the present invention is applicable to other coating liquids such as a developing solution. Although the vacuum suction has been employed as the attaching/detaching means, the present invention is not limited to this. In addition, although the case where the semiconductor wafer is employed as the object to be coated has been explained, the present invention is not limited to this. For example, the LCD glass substrate may be employed.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A coating apparatus comprising:

a spin chuck for supporting a substrate to be coated rotatably;

a driving mechanism for rotating the spin chuck;

a coating liquid supplying mechanism for supplying a coating solution to the substrate to be coated supported by the spin chuck;

an outer cup arranged to surround the substrate to be coated supported by the spin chuck;

an inner cup having a main body and a projecting portion which projects downward around a total circumference of an inner portion of the main body, the projecting portion overlapping in a non-contact fashion with an upper peripheral portion of the substrate to be coated over and being positioned in close vicinity of the upper peripheral portion upon coating, and the inner diameter of said projecting portion being smaller than the diameter of the substrate, wherein the inner cup is split radially into pieces and respective pieces can be moved radially; and an attaching/detaching mechanism for attaching and detaching the inner cup.

2. The coating apparatus according to claim 1, wherein the inner cup is put on the outer cup upon coating.

3. The coating apparatus according to claim 2, wherein the outer cup has a downward-inclined portion to align the inner cup and a flange portion on which the inner cup is put in its inner area.

4. The coating apparatus according to claim 1, further comprising a nozzle for discharging a removing liquid to remove the coating liquid on the substrate to be coated, and a discharge outlet of the nozzle is directed toward an upper area of an outer surface of the projection portion of the inner cup.

5. The coating apparatus according to claim 1, wherein the inner cup is attached/detached and held by vacuum-suction.

6. The coating apparatus according to claim 1, further comprising means for forming an air stream flowing through a clearance formed between the projection portion and the substrate from the inner cup toward the outer cup.

7. The coating apparatus according to claim 1, wherein the clearance formed between the projection portion and the substrate is 1 to 5 mm.

8. A coating apparatus for coating a substrate with a coating solution, comprising:

a driving mechanism;

a spin chuck configured to support the substrate to be coated rotatably, the spin chuck being rotatably mounted to the driving mechanism;

a coating liquid supplying mechanism configured to supply the coating solution to the substrate;

an outer cup arranged to surround the substrate;

an inner cup having a main body and a projecting portion configured to project downward around a total circumference of an inner portion of the main body, the projecting portion configured to overlap in a non-contact fashion with an upper peripheral portion of the substrate and being positioned in close vicinity of the upper peripheral portion upon coating, the projecting portion having an inner diameter configured to be smaller than a diameter of the substrate; and an attaching/detaching mechanism configured to attach the inner cup to the outer cup and detach the inner cup from the outer cup.

9. The coating apparatus according to claim 8, wherein the inner cup is put on the outer cup upon coating.

10. The coating apparatus according to claim 9, wherein the outer cup has a downward-inclined portion to align the inner cup and a flange portion on which the inner cup is put in its inner area.

11. The coating apparatus according to claim 8, further comprising a nozzle for discharging a removing liquid to remove the coating liquid on the substrate to be coated, and a discharge outlet of the nozzle is directed toward an upper area of an outer surface of the projection portion of the inner cup.

12. The coating apparatus according to claim 8, wherein the inner cup is attached/detached and held by vacuum suction.

13. The coating apparatus according to claim 8, wherein the inner cup is split radially into pieces and respective split pieces can be moved radially.

14. The coating apparatus according to claim 8, further comprising means for forming an air stream flowing through a clearance formed between the projection portion and the substrate from the inner cup toward the outer cup.

15. The coating apparatus according to claim 8, wherein the clearance formed between the projection portion and the substrate is 1 to 5 mm.

* * * * *